United States Patent
Shimofure

(10) Patent No.: US 8,351,500 B2
(45) Date of Patent: Jan. 8, 2013

(54) ENTROPY ENCODER, VIDEO CODING APPARATUS, VIDEO CODING METHOD AND VIDEO CODING PROGRAM

(75) Inventor: Kensuke Shimofure, Tokyo (JP)

(73) Assignee: NEC Corporation, Tokyo (JP)

( * ) Notice: Subject to any disclaimer, the term of this patent is extended or adjusted under 35 U.S.C. 154(b) by 1030 days.

(21) Appl. No.: 12/354,647

(22) Filed: Jan. 15, 2009

(65) Prior Publication Data

US 2009/0180536 A1 Jul. 16, 2009

(30) Foreign Application Priority Data

Jan. 16, 2008 (JP) ................................. 2008-006665

(51) Int. Cl.
*H04N 7/12* (2006.01)

(52) U.S. Cl. ......... 375/240.03; 375/240.01; 375/240.13; 375/240.29

(58) Field of Classification Search ............. 375/240.01, 375/240.29
See application file for complete search history.

(56) References Cited

U.S. PATENT DOCUMENTS

| | | | | |
|---|---|---|---|---|
| 7,400,681 B2 * | 7/2008 | Joch et al. ................ | 375/240.16 |
| 7,746,928 B2 * | 6/2010 | Wang et al. ............... | 375/240.03 |
| 7,916,952 B2 * | 3/2011 | Demos ....................... | 382/232 |
| 2003/0007785 A1 * | 1/2003 | Shimizu ..................... | 386/117 |
| 2006/0165165 A1 * | 7/2006 | Mohsenian ................ | 375/240.03 |
| 2007/0263723 A1 * | 11/2007 | Sekiguchi et al. ........ | 375/240.12 |
| 2008/0013622 A1 * | 1/2008 | Bao et al. .................. | 375/240.1 |
| 2008/0232459 A1 * | 9/2008 | Auyeung .................. | 375/240.01 |
| 2008/0240233 A1 * | 10/2008 | Au et al. ................... | 375/240.02 |
| 2010/0238998 A1 * | 9/2010 | Nanbu et al. ............. | 375/240.03 |

FOREIGN PATENT DOCUMENTS

| | | |
|---|---|---|
| JP | 2005-005862 A | 1/2005 |
| JP | 2005-223533 A | 8/2005 |
| JP | 2006-279333 A | 10/2006 |
| JP | 2007-074337 A | 3/2007 |
| JP | 2007-116436 A | 5/2007 |

* cited by examiner

Primary Examiner — Christopher Brown
Assistant Examiner — Fahimeh Mohammadi

(57) ABSTRACT

An entropy encoder, a video coding apparatus, a video coding method and a video coding program can cope with the adverse effects that arise as a result of a local increase of overhead code quantity. The quantization parameter output form the code quantity control unit of a video coding apparatus is input to a third arithmetic unit before being input to the context initializer in an entropy encoder and a quantization parameter offset value is subtracted from it there. The discrepancy relating the generation probability of a symbol where significant coefficients exist can be improved by initializing an arithmetic coding context by using the quantization parameter obtained by subtracting a predetermined value form the quantization parameter defined by a rate control unit.

10 Claims, 5 Drawing Sheets

FIG.2

ENTROPY ENCODER, VIDEO CODING APPARATUS, VIDEO CODING METHOD AND VIDEO CODING PROGRAM

CROSS REFERENCE TO RELATED APPLICATIONS

This application is based upon and claims the benefit of priority from Japanese Patent Application No. 2008-006665, filed on Jan. 16, 2008, the disclosure of which is incorporated herein in its entirety by reference.

TECHNICAL FIELD

The present invention relates to an entropy encoder that employs video coding techniques, a video coding apparatus, a video coding method and a video coding program. More particularly, the present invention relates to an entropy encoder characterized by context initialization and also to a video coding apparatus, a video coding method and a video coding program that are adapted to employ such an entropy encoder.

BACKGROUND ART

A video coding apparatus is an apparatus that executes a coding process conforming to a predetermined video coding system on externally input video data and generates a bit stream. Video coding systems being used for coding processes in video coding apparatus include the Advanced Video Coding System (which is an advanced moving image compression coding system). This system conforms to the MPEG (Moving Picture Experts Group)-4 Standard—Part 10 and the Joint Model System is known as a reference model for coding. Ordinary video coding apparatus based on the Joint Model System will be referred to as the first related technique of the present invention hereinafter.

FIG. 3 of the accompanying drawings schematically illustrated a video coding apparatus of the first related technique, showing the configuration thereof. The video coding apparatus 100 of the first related technique includes an image frame buffer 102 for sequentially storing image frames that constitutes video data 101 to be compressed. Video data 103 having macroblocks as units formed by dividing an image into image regions of a predetermined size is output from the image frame buffer 102. The video data 103 is input to a macroblock encoder 104, which encodes the video on a macroblock by macroblock basis. The macroblock encoder 104 is connected to a code quantity control unit 105 and a decoded picture buffer 106 for storing a plurality of reference images for the purpose of motion compensation. The decoded picture buffer 106 is also connected to a predictor 112. The macroblock encoder 104 outputs a coded picture stream 107. A macroblock and a picture will be defined hereinafter.

The macroblock encoder 104 of the video coding apparatus 100 having the above-described configuration is formed by the macroblock buffer 111 for receiving video data 103 as input, the predictor 112 for predicting a motion connected to it, a first arithmetic unit 113 for subtracting the output of the predictor 112 from the output of the macroblock buffer 111, a converter/quantizer 114 for converting and quantizing the results of the arithmetic operation of the first arithmetic unit 113 under the control of the coded quantity control unit 105, an entropy encoder 115, an inverse quantizer/inverse converter 116, the entropy encoder 115 and the inverse quantizer/inverse converter 116 being arranged at the output side of the converter/quantizer 114, and a second arithmetic unit 117 arranged at the output side of the inverse quantizer/inverse converter 116 for additions.

It is assumed here that the video signal format of the video data 101 input to the video coding apparatus 100 is the QCIF (quarter common intermediate format). The QCIF is one of the video signal formats defined by the ITU (International Telecommunication Union).

FIG. 4 of the accompanying drawings schematically illustrates an image frame of the video signal format, or the QCIF. A QCIF image frame has 176×144 macroblocks. The image of a frame is formed by a frame picture in the case of progressive scanning. It is formed by two frame pictures in the case of interlaced scanning. In the following description, either frame picture will be simply referred to as a picture.

A macroblock that is a unit for forming a picture is by turn formed by 16×16 luminance pixels and 8×8 Cr (color difference signal) and Cb (color difference signal) color difference pixels. FIG. 4 shows the luminance positions (x) and the color difference positions (o) of a 4×4 pixel block formed by dividing a macroblock of 16×16 pixels by 16.

The macroblock encoder 104 illustrated in FIG. 3 of the accompanying drawings is designed to encode video data 103, using a macroblock as unit. The video data is coded progressively as it is raster scanned from the upper left corner to the lower right corner as in the case of raster scanning of television.

Firstly, the macroblock buffer 111 of the macroblock encoder 104 reads in the video data 103 to be coded on a macroblock by macroblock basis so as to temporarily accumulate the data and supply it to the downstream converter/quantizer 114. At this time, the first arithmetic unit 113 operates to subtract a predicted image 122 output from the predictor 112 from the image 121 of the macroblocks read out from the macroblock buffer 111 and supplies the predicted error image 123 that is obtained as a result of the arithmetic operation to the converter/quantizer 114.

The converter/quantizer 114 operates for frequency conversion of the predicted error image 123 by a unit smaller than a macroblock. Then, it converts the predicted error image 123 from a space region into a frequency region. According to the AVC (advanced Video Coding) Standard, frequency conversion can be utilized for luminance pixels by a unit of 8×8 or 4×4 blocks. A predicted error image converted into a frequency region is referred to as conversion coefficient hereinafter. A conversion coefficient is quantized according to the quantization parameter 125 supplied from the code quantity control unit 105 and then supplied to the entropy encoder 115 and the inverse quantizer/inverse converter 116 as code data 126. The entropy encoder 115 is a compression device that operates for compression by assigning a code having a length that varies as a function of the level of probability of generation of data. The quantization parameter 125 is supplied also to the entropy encoder 115.

The inverse quantizer/inverse converter 116 inversely quantizes the quantized value supplied from the converter/quantizer 114 and then operates for invert frequency conversion thereof before returning it to the original space region. Then, a decoded image 128 is obtained by adding the predicted image 122 supplied from the predictor 112 to the predicted error image returned to the space region at the second arithmetic unit 117. The decoded image 128 is stored in the decoded picture buffer 106 for a subsequent coding operation.

The entropy encoder 115 operates for entropy coding of the input code data 126 and outputs a bit stream 107. The present invention closely relates to the entropy encoder 115 and hence it will be described in detail hereinafter.

The predictor 112 supplies a generation parameter of predicted image to the entropy encoder 115 as code data 129. The generation parameter of predicted image may be a prediction mode such as inter-frame prediction mode or intra-frame prediction mode, an index of a decoded frame used for inter-frame prediction, a motion vector used for inter-frame prediction or an intra-frame predictive direction used for intra-frame prediction.

The decoded picture buffer 106 stores the decoded image 128 supplied from the inverse quantizer/inverse converter 116 as pointed out above and manages the decoded image picture reconstructed by using it.

The code quantity control unit 105 monitors the bit stream 131 output from the entropy encoder 115 for coding a picture by a target number of bits. Then, if the number of bits of the output bit stream 131 is greater than the target number of bits, it outputs a parameter that increases the quantization step size as the quantization parameter 125. Conversely, if the number of bits of the output bit stream 131 is smaller than the target number of bits, it outputs a parameter that decreases the quantization step size as the quantization parameter 125.

The first related technique of the present invention employs CABAC (context-based adaptive binary arithmetic coding) for the entropy encoder 115 for entropy coding just like the present invention. With this coding technique, the number of symbols (bins) input to an arithmetic encoder, which will be described in detail hereinafter, is also monitored. Then, the quantization parameter is adjusted so as to make the ratio of the number of bits to the number of bins meet the requirement of ratio defined in the above-cited AVC Standard.

FIG. 5 of the accompanying drawings is a schematic block diagram of an entropy encoder that can be used with the first related technique of the present invention illustrated in FIG. 3, showing the configuration thereof. The entropy encoder 115 includes a binarizer 141 for binarizing the code data 126 supplied from the converter/quantizer 114 shown in FIG. 3 and a context initializer 143 for receiving the quantization parameter 125 output from the code quantity control unit 105 as input. The quantization parameter 125 is also output to the outside of the entropy encoder 115 simply as it is as slice quantization parameter.

The binarizer 141 converts the input code data 126 into a binary string 144 according to the sequence defined in the H.264 Standard that is a standard for compression coding system of moving image data. The symbol (bin) of the binary string output from a switch 145 that operates for receiving the binary string 144 as input and also for switching is then input to an arithmetic encoder 148 and a context updater 149. The context initializer 143 receives the quantization parameter 125 as input and then it inputs an initialization signal 151 to the context updater 149 and initializes the context variable information at the head of a slice having a predetermined number of macroblocks that is a decoding unit of the above-described CABAC. The context updater 149 supplies the most probable symbol 152 and the state number 153 that are stored and correspond to the symbol 147 supplied to the arithmetic encoder 148 to the arithmetic encoder 148.

The arithmetic encoder 148 operates for binary arithmetic coding of the symbol 147 of the binary string that is sequentially supplied from the switch 145, utilizing the most probable symbol 152 and the state number 153 supplied from the context updater 149. A state number 153 is the number of the table that stores the value corresponding to the generation probability of a least probable symbol defined in the AVC (Advanced Video Coding) Standard. The most probable symbol 152 and the state number 153 that are updated by the operation of binary arithmetic coding of the arithmetic encoder 148 are stored in the context updater 149.

The bin number data 154 is output to the outside of the entropy encoder 115 from the switch 145 and the bit number data 155 is output to the outside of the entropy encoder 115 from the arithmetic encoder 148.

With the first related technique of the present invention, the quantization parameter 125 output from the code quantity control unit 105 shown in FIG. 3 is directly input to the context initializer 143. In other words, when the quantization parameter 125 output from the code quantity control unit 105 is referred to as quantization parameter for a quantization process and the quantization parameter 125 input to the context initializer 143 is referred to as slice quantization parameter, the quantization parameter for a quantization process and the slice quantization parameter are equal to each other.

On the other hand, a technique of varying a slice quantization parameter itself by means of a table is proposed (refer to, e.g., Patent Document 1: JP-A-2005-005862 [paragraph No. 0011, paragraphs No. 0033 through 0039, FIGS. 1 and 4]), which will be referred to as the second related technique of the present invention hereinafter. More specifically, with this technique, a reference quantization scale Qb defined by a code quantity control circuit is made to vary between 1/b and b times (where b is an adaptive level for each macroblock and indicates the control range relative to the reference quantization scale Qb) and to be used as a quantization scale at the time of coding.

The second related technique is designed to execute an adaptive quantization process that suppresses adverse effects to a code quantity control circuit and prevents image degradation from taking place particularly when the bit rate is low. Then, as a result, it is possible to suppress the compression ratio to below a predetermined level and also any visually noticeable degradation.

Meanwhile, if a macroblock that contains significant coefficients to a large extent appears at the head of a slice in the case of low bit rate coding conforming to the H.264 Standard, the quantity of generated codes of symbols of existence of significant coefficients (to be referred to as overhead code quantity hereinafter) extremely increases for the macroblock. Additionally, the overhead code quantity also extremely increases for a macroblock that contains significant coefficients to a large extent and appears after macroblocks that scarcely contain significant coefficients are coded successively from the head of a slice. Such a local increase of overhead code quantity is problematic because it not only entails degradation of image quality due to a reduced compression efficiency but also gives rise to a possibility of becoming no longer able to meet the requirement of the upper limit macroblock bit number defined in the H.264 Standard.

Such a problem is different from the technical problem to be solved by the second related technique of the present invention of making a reference quantization scale Qb vary between 1/b and b times. In other words, the problem cannot be solved by the second related technique of the present invention.

SUMMARY OF INVENTION

In view of the above-identified circumstances, it is therefore the object of the present invention to provide an entropy encoder, a video coding apparatus, a video coding method and a video coding program that can cope with the adverse effects that arise as a result of a local increase of overhead code quantity.

In an aspect of the present invention, the above object is achieved by providing an entropy encoder including:

(a) a binarizer for converting the input code data into a binary string according to the sequence defined for a moving image data compression coding system;

(b) a switch for receiving the binary string obtained as a result of the conversion by the binarizer as input and outputting a symbol of the binary string;

(c) an arithmetic coder for receiving the symbol of the binary string output from the switch as input and outputting the bit stream obtained as a result of entropy coding;

(d) a context updater for supplying a most probable symbol and a state number corresponding to the symbol of the binary string supplied to the arithmetic coder to the arithmetic coder;

(e) an arithmetic unit for receiving a quantization parameter as input and outputting a slice quantization parameter obtained by subtracting a predetermined quantization parameter offset from the input quantization parameter, the slice quantization parameter being smaller than the quantization parameter by the predetermined quantization parameter offset; and (f) a context initializer for receiving the slice quantization parameter output from the arithmetic unit and initializing the context updater at the head of a slice that is a decoding unit of a code at the time of entropy coding.

In another aspect of the present invention, there is provided a video coding apparatus including:

(a) a code quantity controller for monitoring the bit stream obtained by coding an input image by a unit of macroblock obtained by dividing the input image by a unit of image region of a predetermined size and outputting a quantization parameter to be used for a quantization process of adjusting the bit rate of arithmetic coding according to a context;

(b) a subtractor for receiving the quantization parameter output from the code quantity controller as input and subtracting a predetermined value from it as an offset value;

(c) a context initializer for initializing the context at the head of a slice having a predetermined number of macroblocks by means of the quantization parameter obtained after the subtraction by the subtracter.

In still another aspect of the present invention, there is also provided a video coding method including:

(a) a code quantity control step of monitoring the bit stream obtained by coding an input image by a unit of macroblock obtained by dividing the input image by a unit of image region of a predetermined size and outputting a quantization parameter to be used for a quantization process of adjusting the bit rate of arithmetic coding according to a context;

(b) a subtraction step of receiving the quantization parameter output in the code quantity control step as input and subtracting a predetermined value from it as an offset value;

(c) a context initializing step of initializing the context at the head of a slice having a predetermined number of macroblocks by means of the quantization parameter obtained after the subtraction in the subtraction step.

In a further aspect of the present invention, there is provided a video coding program for causing the computer of a video coding apparatus for executing a coding process conforming to a predetermined video coding system on video data and generating a bit stream, the program being adapted to cause the computer to execute:

(a) a code quantity control process of monitoring the bit stream obtained by coding an input image by a unit of macroblock obtained by dividing the input image by a unit of image region of a predetermined size and outputting a quantization parameter to be used for a quantization process of adjusting the bit rate of arithmetic coding according to a context;

(b) a subtraction process of receiving the quantization parameter output from the code quantity controller as input and subtracting a predetermined value from it as an offset value;

(c) a context initializing process of initializing the context at the head of a slice having a predetermined number of macroblocks by means of the quantization parameter obtained after the subtraction in the subtraction process.

Thus, the present invention as described above provides an advantage of simplifying the configuration of a video coding apparatus because it is adapted to employ a fixed offset value.

BRIEF DESCRIPTION OF DRAWINGS

FIG. 2 A schematic block diagram of the entropy encoder of the embodiment of FIG. 1, showing the configuration thereof.

DESCRIPTION OF EMBODIMENTS

Now, a preferred embodiment of the present invention will be described in greater detail by referring to the accompanying drawings.

Figure 1:
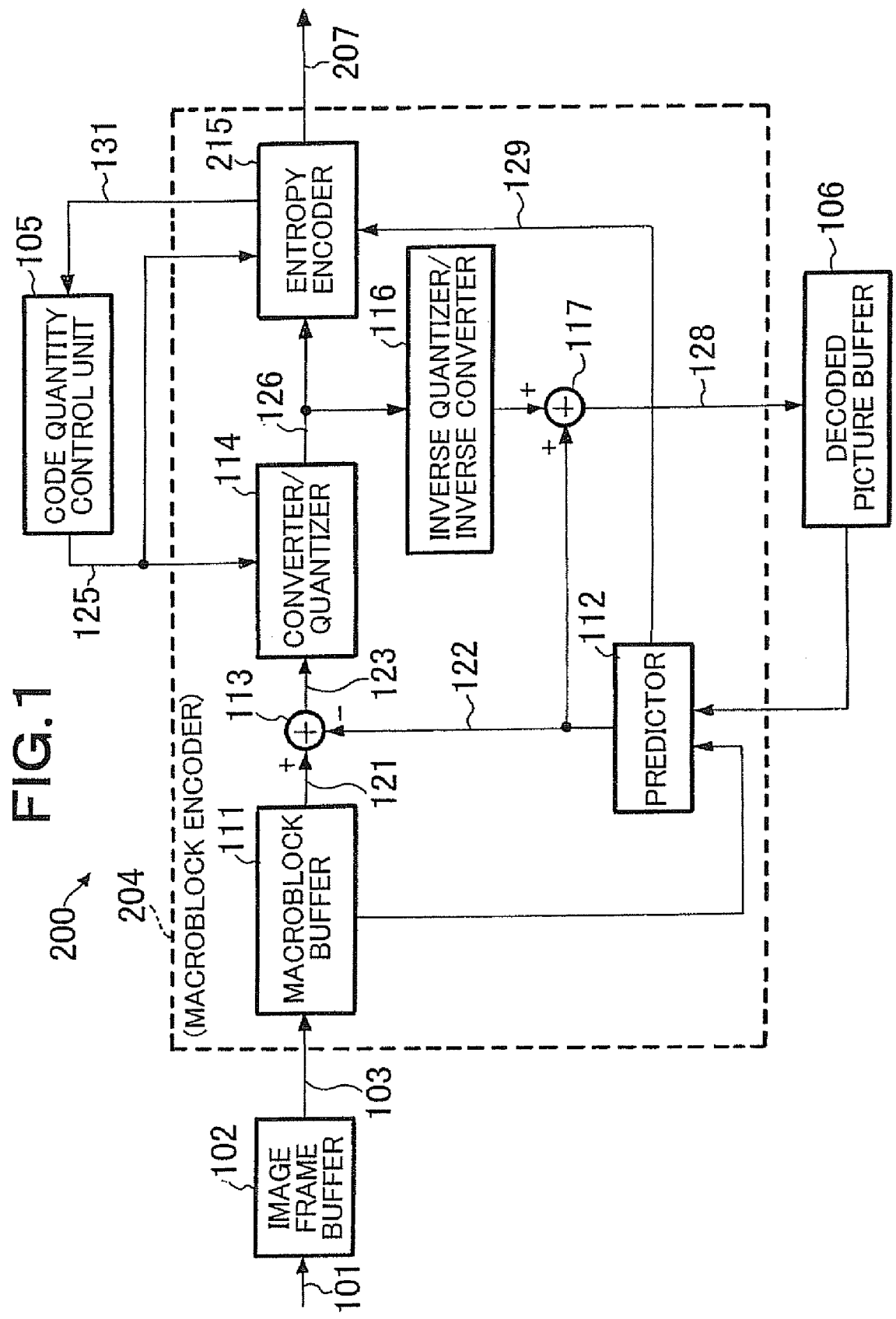
FIG. 1 A schematic block diagram of an embodiment of video coding apparatus according to the present invention, showing the configuration thereof.
Figure 3:
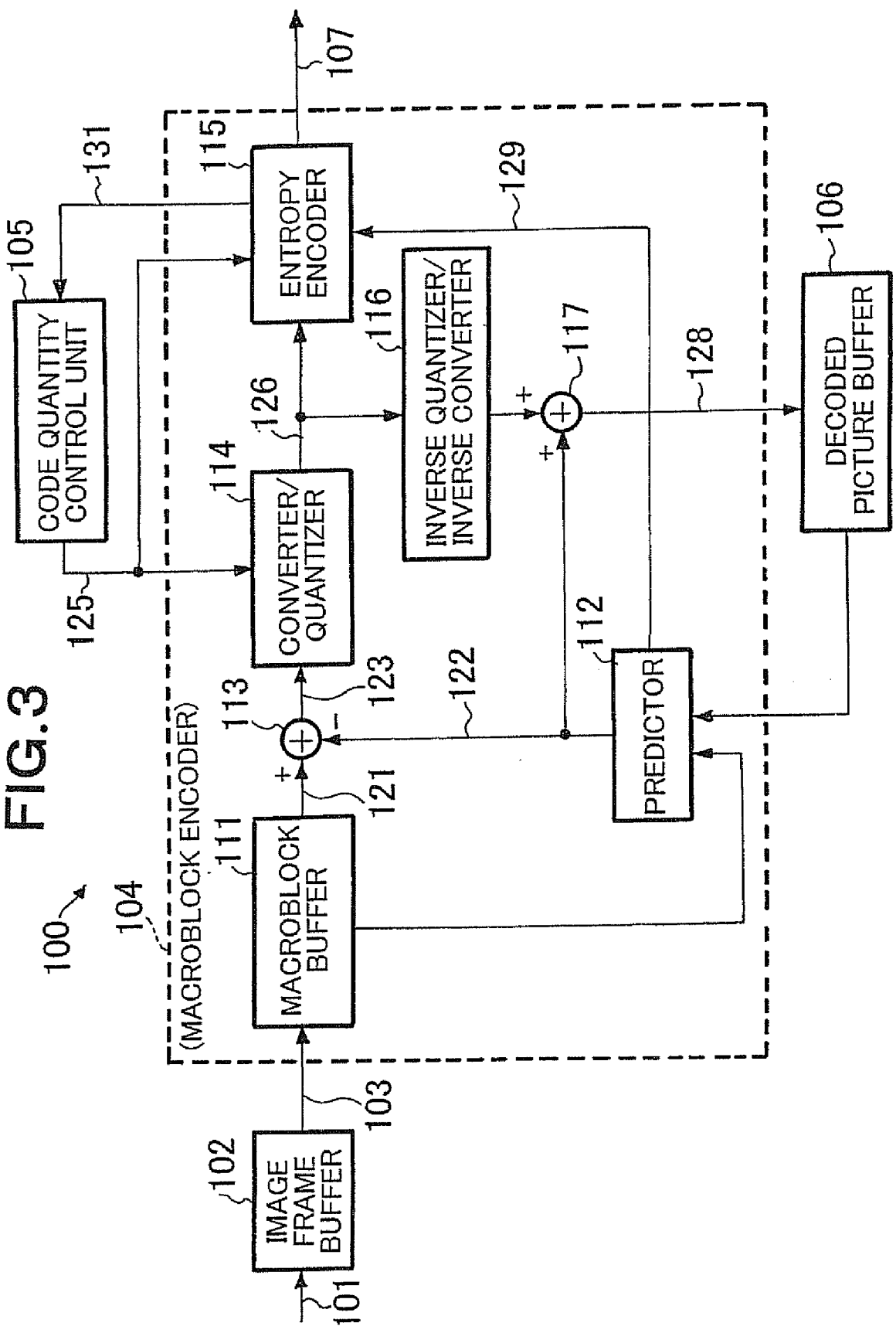
FIG. 3 A schematic block diagram of a video coding apparatus according to the first related technique of the present invention, showing the configuration thereof.
Figure 4:
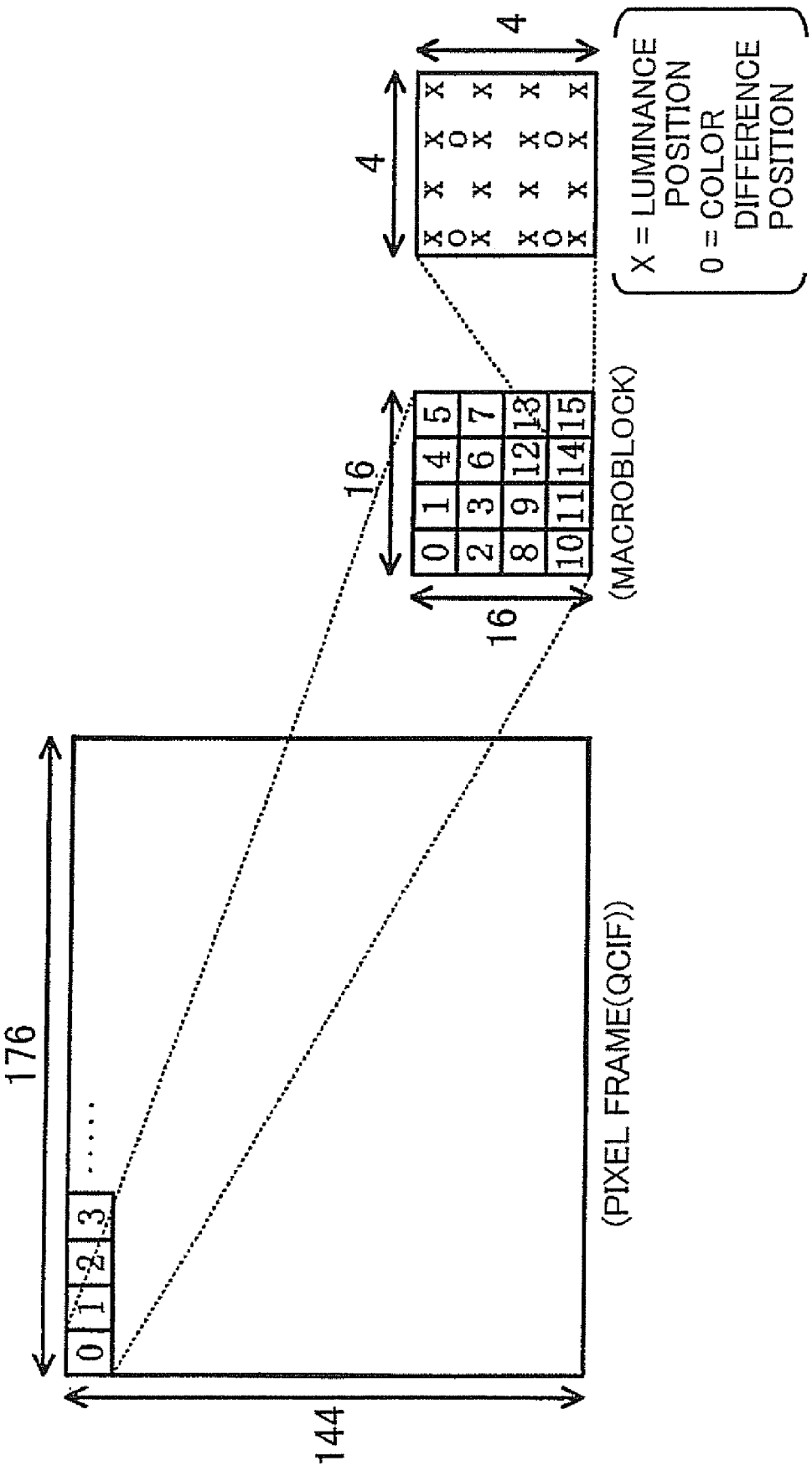
FIG. 4 A schematic illustration of an image frame of a video format, which is the QCIF.

FIG. 1 is a schematic block diagram of an embodiment of video coding apparatus according to the present invention, showing the configuration thereof. The video coding apparatus 200 of this embodiment has a configuration same as the video coding apparatus 100 of the first related technique of the present invention shown in FIG. 3 except the entropy encoder 215 in the macroblock encoder 204 of the video coding apparatus 200 differs from the entropy encoder 115 in the macroblock encoder 104 of the video apparatus 100. Therefore, the components in FIG. 1 that are same as those of FIG. 3 are denoted respectively by the same reference symbols and will not be described any further. In this embodiment, the encoded bit stream 207 is output from the entropy encoder 215 in the macroblock encoder 204.

Figure 2:
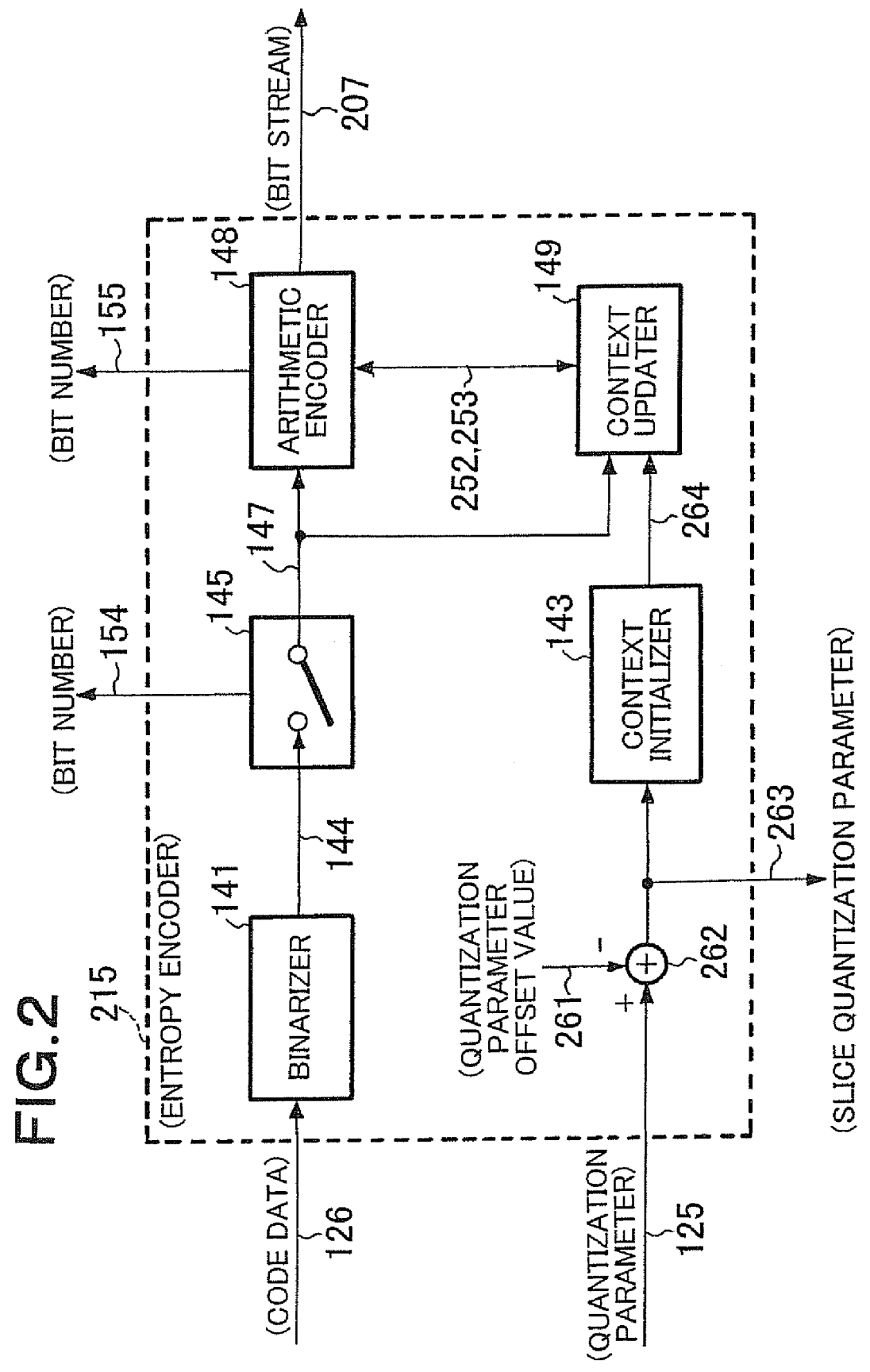
Figure 5:
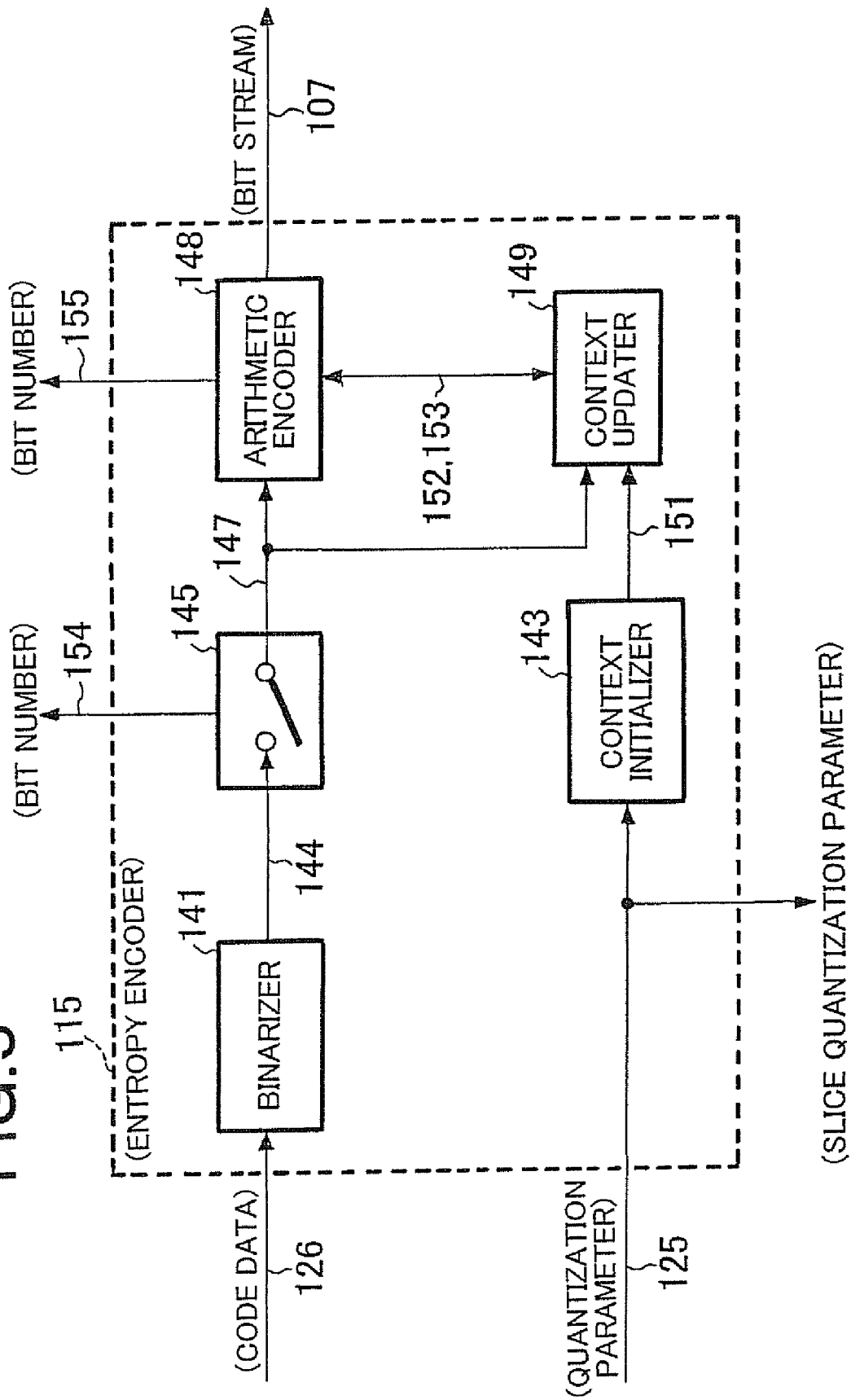
FIG. 5 A schematic block diagram of an entropy encoder according to the first related technique of the present invention.

FIG. 2 is a schematic block diagram of the entropy encoder of the embodiment of FIG. 1, showing the configuration thereof. Again, the components in FIG. 2 that are same as those of FIG. 5 are denoted respectively by the same reference symbols and will not be described any further whenever appropriate.

The entropy encoder 215 of this embodiment has a third arithmetic unit 262 that receives the quantization parameter 125 as input and adds the quantization parameter offset value 261 to it. The slice quantization parameter 263 that is output from the third arithmetic unit 262 as the outcome of the arithmetic operation is input to the context initializer 143. An initialization signal 264 is output from the context initializer 143 to initialize the context updater 143 at the head of the slice that is the decoding unit of CABAC.

The context updater 149 supplies the most probable symbol 252 and the state number 253, which are stored and correspond to the symbol 147 supplied to the arithmetic encoder 148, to the arithmetic encoder 148.

The arithmetic encoder 148 encodes the symbol 147 of the binary string sequentially supplied from the switch 145 by binary arithmetic coding, utilizing the most probable symbol 252 and the state number 253 supplied from the context updater 149. The state number 253 is the number of the table that stores the value corresponding to the generation probability of a least probable symbol defined in the AVC (Advanced Video Coding) Standard. The most probable symbol 252 and the state number 253 updated by the binary arithmetic coding of the arithmetic encoder 148 are stored in the context updater 194.

Meanwhile, in this embodiment, the slice quantization parameter 263 is obtained by subtracting a quantization parameter offset value 261 from the value of the quantization parameter 125. In other words, the context is initialized by using the outcome of subtraction that is obtained by subtracting a predetermined quantization parameter offset value 261 from the quantization parameter 125 supplied from the code quantity control unit 105 (FIG. 1).

In this way, it is possible to select a high generation probability for a symbol containing significant coefficients by initializing the context according to the slice quantization parameter 263 that is reduced by a quantization parameter offset. Then, as a result, it is possible to reduce the overhead code quantity of a macroblock where a large number of significant coefficients exist at the time of low bit rate video coding when the code quantity control unit 105 outputs a large quantization parameter 125.

Meanwhile, when the number of symbols where significant coefficients exist is increased by inputting a quantization parameter offset value 261 to the third arithmetic unit 262 as difference quantization parameter, the efficiency of arithmetic coding is expected to be degraded because the generation probability of symbols where significant coefficients exist is not optimized for a macroblock having only few significant coefficients. However, such expected degradation does not give rise to any particular problem for the following reason.

The number of symbols increases by 50 bins per slice. The difference quantization parameter (mb_qp_delta) that can be transmitted on a macroblock by macroblock basis according to the H.264 Standard is from "−26" to "25" and the maximum value is "25". Therefore, "25" is selected for the quantization parameter offset value.

The degradation in efficiency of arithmetic coding arises in a macroblock having only few significant coefficients. However, a macroblock having only few significant coefficients shows a small overhead code quantity because the number of symbols input to the arithmetic encoder is small. Additionally, since the compression ratio of arithmetic coding is reduced only 63 times at most because of the makeup of the H.264 Standard, the code quantity increases only in several MB periods for the following reason.

With arithmetic coding conforming to the H.264 Standard, the coding operation proceeds while updating "state (pStateIdx)" and "most probable symbol (valMPS)" ("StateIdx" is between "0" and "62" and "valMPS" is "0" or "1"). "pStateIdx" is incremented by "+N" (the increment is obtained by looking up a predefined table) when a most probable symbol is generated and decremented by "−1" when a least probable symbol is generated. A most probable symbol is inverted when a least probable symbol is generated in a state of "pStateIdx=0".

Basically, the quantity of generated codes increases relative to least probable symbols but decreases relative to most probable symbols. According to the H.264 Standard, the coding efficiency is raised by coding while adaptively changing the state by means of inputs. Then, the initial value of "pStateIdx" and that of "valMPS" are determined when the context is initialized. Originally, the H.264 Standard assumes that the initialization is realized by the quantization parameter determined by the code quantity control unit. Therefore, no optimum initial value can be obtained to reduce the compression ratio when a value obtained by subtracting a quantization parameter offset is employed for the initialization.

However, again, the state is adaptively updated according to the input as pointed out above so that the state converges to an appropriate one and the number of transitions for the convergence is "maximally 63 times". In other words, a symbol that is inverse relative to the proper most probable symbol becomes "valMPS" as a result of initialization and the value of "valMPS" is inverted by coding the least probable symbol 63 times even when "pStateIdx" becomes to be equal to the maximal value of 62. Therefore, the proper most probable symbol becomes "valMPS" thereafter and no reduction of the compression ratio takes place.

Additionally, since there are 16 symbols where significant coefficients exist per 1 MB so that if a least probable symbol is generated to all of them, the quotient obtained by dividing "63" by "16" is about "4" so that "the code quantity increases only in several MB periods".

Although the exemplary embodiments of the present invention have been described in detail, it should be understood that various changes, substitution and alternatives can be made therein without departing from the spirit and scope of the invention as defined by the appended claims. Further, it is the inventor's intent to retain all equivalents of the claimed invention even if the claims are amended during prosecution.

The invention claimed is:

1. An entropy encoder comprising:
a binarizer for converting the input code data into a binary string according to the sequence defined for a moving image data compression coding system;
a switch for receiving the binary string obtained as a result of the conversion by the binarizer as input and outputting a symbol of the binary string;
an arithmetic coding unit for receiving the symbol of the binary string output from the switch as input and outputting the bit stream obtained as a result of entropy coding;
a context updater for supplying a most probable symbol and a state number corresponding to the symbol of the binary string supplied to the arithmetic coding unit to the arithmetic coding unit;
an arithmetic unit for receiving a quantization parameter as input and outputting a slice quantization parameter obtained by subtracting a predetermined quantization parameter offset from the input quantization parameter, the slice quantization parameter being smaller than the quantization parameter by the predetermined quantization parameter offset; and
a context initializer for receiving the slice quantization parameter output from the arithmetic unit and initializing the context updater at the head of a slice that is a decoding unit of a code at the time of entropy coding.

2. The entropy encoder according to claim 1, wherein CABAC (Context-based Adaptive Binary Arithmetic Coding) is employed for entropy coding and the H.264 Standard is adopted for the compression coding system for coding moving image data, the offset value being "25" according to the H.264 Standard.

3. A video coding apparatus comprising:
- a code quantity controller for monitoring the bit stream obtained by coding an input image by a unit of macroblock obtained by dividing the input image by a unit of image region of a predetermined size and outputting a quantization parameter to be used for a quantization process of adjusting the bit rate of arithmetic coding according to a context;
- a subtracter for receiving the quantization parameter output from the code quantity controller as input and outputting a slice quantization parameter obtained by subtracting a predetermined quantization parameter offset value from the input quantization parameter, the slice quantization parameter being smaller than the quantization parameter by the predetermined quantization parameter offset;
- a context initializer for initializing the context at the head of a slice having a predetermined number of macroblocks by means of the quantization parameter obtained after the subtraction by the subtracter.

4. The apparatus according to claim 3, wherein the predetermined quantization parameter offset value is the maximum value in the range of values that the difference expressing parameter can take, the difference expressing parameter expressing the difference between the quantization parameter to be used for the quantization process and the slice quantization parameter that is the quantization parameter to be used for initialization of the context.

5. The apparatus according to claim 3, wherein the H.264 Standard is adopted for the compression coding system for coding moving image data.

6. The apparatus according to claim 4, wherein the maximum value of the predetermined quantization parameter offset value is "25" according to the H.264 Standard that is a compression coding system standard for moving image data.

7. A video coding method comprising:
- a code quantity control step of monitoring the bit stream obtained by coding an input image by a unit of macroblock obtained by dividing the input image by a unit of image region of a predetermined size and outputting a quantization parameter to be used for a quantization process of adjusting the bit rate of arithmetic coding according to a context;
- a subtraction step of receiving the quantization parameter output in the code quantity control step as input and outputting a slice quantization parameter obtained by subtracting a predetermined quantization parameter offset value from the input quantization parameter, the slice quantization parameter being smaller than the quantization parameter by the predetermined quantization parameter offset;
- a context initializing step of initializing the context at the head of a slice having a predetermined number of macroblocks by means of the quantization parameter obtained after the subtraction in the subtraction step.

8. The method according to claim 7, wherein the predetermined quantization parameter offset value is the maximum value in the range of values that the difference expressing parameter can take, the difference expressing parameter expressing the difference between the quantization parameter to be used for the quantization process and the slice quantization parameter that is the quantization parameter to be used for initialization of the context.

9. A video coding program for causing the computer of a video coding apparatus for executing a coding process conforming to a predetermined video coding system on video data and generating a bit stream, the program being adapted to cause the computer to execute:
- a code quantity control process of monitoring the bit stream obtained by coding an input image by a unit of macroblock obtained by dividing the input image by a unit of image region of a predetermined size and outputting a quantization parameter to be used for a quantization process of adjusting the bit rate of arithmetic coding according to a context;
- a subtraction process of receiving the quantization parameter output in the code quantity control process as input and outputting a slice quantization parameter obtained by subtracting a predetermined quantization parameter offset value from the input quantization parameter, the slice quantization parameter being smaller than the quantization parameter by the predetermined quantization parameter offset;
- a context initializing step of initializing the context at the head of a slice having a predetermined number of macroblocks by means of the quantization parameter obtained after the subtraction in the subtraction process.

10. The program according to claim 9, wherein the predetermined quantization parameter offset value is the maximum value in the range of values that the difference expressing parameter can take, the difference expressing parameter expressing the difference between the quantization parameter to be used for the quantization process and the slice quantization parameter that is the quantization parameter to be used for initialization of the context.

* * * * *